US011043756B2

(12) United States Patent
Desbonnets et al.

(10) Patent No.: US 11,043,756 B2
(45) Date of Patent: Jun. 22, 2021

(54) STRUCTURE FOR RADIO FREQUENCY APPLICATIONS

(71) Applicant: Soitec, Bernin (FR)

(72) Inventors: Eric Desbonnets, Lumbin (FR); Bernard Aspar, Saint-Ismier (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/480,249

(22) PCT Filed: Jan. 29, 2018

(86) PCT No.: PCT/FR2018/050196
§ 371 (c)(1),
(2) Date: Jul. 23, 2019

(87) PCT Pub. No.: WO2018/142052
PCT Pub. Date: Aug. 9, 2018

(65) Prior Publication Data
US 2019/0372243 A1    Dec. 5, 2019

(30) Foreign Application Priority Data

Feb. 2, 2017    (FR) ...................................... 1750870

(51) Int. Cl.
*H01Q 23/00*    (2006.01)
*H01L 21/762*    (2006.01)
(Continued)

(52) U.S. Cl.
CPC ....... *H01Q 23/00* (2013.01); *H01L 21/76251* (2013.01); *H01L 29/66772* (2013.01);
(Continued)

(58) Field of Classification Search
CPC ................. H01Q 23/00; H01Q 1/2283; H01L 21/76251; H01L 29/66772;
(Continued)

(56) References Cited

U.S. PATENT DOCUMENTS 4,713,676 A * 12/1987 Thim .................. H01L 29/7881
257/289
5,841,623 A * 11/1998 Denison .............. H01L 21/6831
361/234
(Continued)

FOREIGN PATENT DOCUMENTS

WO    2010/108807 A1    9/2010
WO    2016/016532 A1    2/2016
(Continued)

OTHER PUBLICATIONS

International Search Report for International Application No. PCT/FR2018/050196 dated May 24, 2018, 2 pages.
(Continued)

*Primary Examiner* — Don P Le
(74) *Attorney, Agent, or Firm* — TraskBritt (57) ABSTRACT

A structure for radiofrequency applications includes a high-resistivity support substrate having a front face defining a main plane, a charge-trapping layer disposed on the front face of the support substrate, a first dielectric layer disposed on the charge-trapping layer, an active layer disposed on the first dielectric layer, at least one buried electrode disposed above or in the charge-trapping layer. The buried electrode comprises a conductive layer and a second dielectric layer.

18 Claims, 4 Drawing Sheets

(51) Int. Cl.
  *H01L 29/66* (2006.01)
  *H01L 29/786* (2006.01)
  *H01Q 1/22* (2006.01)

(52) U.S. Cl.
  CPC .. *H01L 29/78603* (2013.01); *H01L 29/78615* (2013.01); *H01Q 1/2283* (2013.01)

(58) Field of Classification Search
  CPC ......... H01L 29/78603; H01L 29/78615; H01L 21/762; H01L 21/7624
  USPC ........................................................ 343/702
  See application file for complete search history.

(56) References Cited

U.S. PATENT DOCUMENTS

| | | | |
|---|---|---|---|
| 9,514,987 B1 | 12/2016 | Gambino et al. | |
| 2004/0129977 A1 | 7/2004 | Ohkubo et al. | |
| 2004/0262702 A1* | 12/2004 | Herner | H01L 21/28088 257/411 |
| 2010/0148241 A1* | 6/2010 | Akiyama | H01L 29/40117 257/324 |
| 2015/0325584 A1* | 11/2015 | Cheng | H01L 21/762 257/324 |
| 2016/0336991 A1* | 11/2016 | Mason | H01L 21/84 |
| 2017/0038211 A1* | 2/2017 | Ayazi | G01C 19/5684 |
| 2017/0062452 A1* | 3/2017 | Syu | H01L 29/78603 |
| 2017/0338143 A1* | 11/2017 | Peidous | H01L 21/02164 |
| 2019/0181827 A1* | 6/2019 | Timme | H03H 9/54 |
| 2020/0020520 A1* | 1/2020 | Reynaud | H01L 21/76251 |
| 2020/0072778 A1* | 3/2020 | Kravchenko | G01N 27/225 |

FOREIGN PATENT DOCUMENTS

| | | |
|---|---|---|
| WO | 2016/087728 A1 | 6/2016 |
| WO | 2016/161029 A1 | 10/2016 |

OTHER PUBLICATIONS

International Written Opinion for International Application No. PCT/FR2018/050196 dated May 24, 2018, 5 pages.
Nguyen et al., Silicon-On-Insulator (SOI) Technology, Manufacture and Applications, Published Oct. 30, 2017, points 10.7 and 10.8, (abstract only).
European Notice under Article 94(3) for European Application No. 18705431.7 dated Apr. 28, 2021, 14 pages.

* cited by examiner

STRUCTURE FOR RADIO FREQUENCY APPLICATIONS

CROSS-REFERENCE TO RELATED APPLICATIONS

This application is a national phase entry under 35 U.S.C. § 371 of International Patent Application PCT/FR2018/050196, filed Jan. 29, 2018, designating the United States of America and published as International Patent Publication WO 2018/142052 A1 on Aug. 9, 2018, which claims the benefit under Article 8 of the Patent Cooperation Treaty to French Patent Application Serial No. 1750870, filed Feb. 2, 2017.

TECHNICAL FIELD

The present disclosure relates to structures for radio frequency (RF) applications. It relates, in particular, to a silicon-on-insulator structure comprising a trapping layer and a buried electrode.

BACKGROUND

Integrated devices are usually produced on substrates in wafer form, which mainly serve as a handle for the manufacture thereof. The increase in the degree of integration and expected performance of these devices has led to ever greater coupling between their performance and the characteristics of the substrate on which they are formed. This is particularly the case for radiofrequency (RF) devices that process signals having a frequency of around 3 kHz to 300 GHz, which are used, in particular, in the field of telecommunications (cellular telephones, Wi-Fi, Bluetooth, etc.).

As an example of device/substrate coupling, the electromagnetic fields from high-frequency signals propagating in the devices penetrate into the depth of the substrate and interact with any charge carriers that may be contained therein. This leads to problems of non-linear distortion of the signal (harmonics), unnecessary consumption of a part of the energy from the signal due to insertion loss, and possible influences between components.

Among the substrates suited to the production of RF devices, high-resistivity silicon substrates are known that comprise a support substrate, a trap-rich layer arranged on the support substrate, a dielectric layer arranged on the trap-rich layer, and a semiconductor layer arranged on the dielectric layer. The support substrate usually has a resistivity higher than 1 kOhm.cm. The trap-rich layer can comprise non-doped polycrystalline silicon. The combination of a high-resistivity support substrate and a trap-rich layer according to the prior art makes it possible to reduce the aforementioned device/substrate coupling, and thus to ensure good performance of the RF devices. In this regard, a person skilled in the art would find a review of the performance of RF devices manufactured on the high-resistivity semiconductor substrate known from the prior art in "Silicon-on-insulator (SOI) Technology, manufacture and applications," points 10.7 and 10.8, Oleg Kononchuk and Bich-Yen Nguyen, Woodhead Publishing.

Furthermore, for the production of RF devices such as, for example, antenna switching units, employed, for example, in mobile telephones, it is common to connect a plurality of transistors (for example, field effect transistors "FET") in series so as to sustain the maximum voltage applied to the terminals of the switching unit, the voltage being higher than the breakdown voltage of each individual transistor. However, the serial arrangement of a plurality of transistors has the drawback of increasing the serial resistance of the RF device, which can, in particular, degrade the linearity performance of the RF device.

BRIEF SUMMARY

The present disclosure aims to solve all or part of the aforementioned drawbacks. One particular aim of the present disclosure is to propose a structure for RF applications that allows the production of RF devices with enhanced performance.

The present disclosure relates to a structure for RF applications comprising:
 a high-resistivity support substrate in which a front surface defines a main plane,
 a charge-trapping layer arranged on the front surface of the support substrate,
 a first dielectric layer arranged on the trapping layer, and
 an active layer arranged on the first dielectric layer.

The structure is characterized in that it comprises at least one buried electrode arranged above or inside the trapping layer, the electrode comprising a conductive layer and a second dielectric layer.

According to other advantageous and non-restrictive characteristics of the present disclosure, taken either separately or in any technically feasible combination:
 the conductive layer has two surfaces parallel to the main plane: one surface in contact with the first dielectric layer and another surface in contact with the second dielectric layer;
 the electrode comprises a plurality of insulating walls extending between the first and second dielectric layers and segmenting the conductive layer into a plurality of conductive blocks, the blocks being insulated from one another by the insulating walls;
 the electrode is arranged between the active layer and the first dielectric layer, the second dielectric layer being in contact with the active layer, parallel to the main plane;
 the electrode is arranged between the first dielectric layer and the charge-trapping layer, the second dielectric layer being in contact with the trapping layer, parallel to the main plane;
 the buried electrode is discontinuous in the main plane and a plurality of charge-trapping areas extend between the first dielectric layer and the charge-trapping layer, the trapping areas being insulated from the conductive blocks by the insulating walls;
 the structure comprises a third dielectric layer, between the charge-trapping layer and the front surface of the support substrate;
 the electrode is located in the charge-trapping layer, the second dielectric layer being in contact with the front surface of the support substrate along the main plane, and wherein the electrode comprises a plurality of insulating walls extending between the first and second dielectric layers and defining a plurality of conductive blocks of the conductive layer, each conductive block being insulated from at least one trapping area forming the trapping layer, by the insulating walls;
 at least one conductive block is electrically connected to a contact pad arranged on a free surface of the active layer, by a conductive via passing through a portion of the structure from the conductive block to the contact pad;
 the structure also comprises a device in and/or on the active layer, including at least one transistor in which a gate electrode arranged on the free surface of the active layer is placed opposite at least one conductive block of the buried electrode;

the second dielectric layer has a thickness of 5 nm to 100 nm;

the conductive layer comprises a material selected among monocrystalline silicon, polycrystalline silicon and amorphous silicon;

the conductive layer has a resistivity of several ohms.cm to several thousand ohms.cm;

the conductive layer has a thickness of 50 nm to 500 nm; and the conductive layer is formed by a material compatible with high-temperature treatments.

BRIEF DESCRIPTION OF THE DRAWINGS

Further characteristics and advantages of the present disclosure will be clear from the detailed description, made in reference to the appended figures, among which.

DETAILED DESCRIPTION

In the following description, the same reference characters in the figures may be used for similar elements.

The figures are diagrammatic representations that, for the sake of readability, are not to scale. In particular, the thicknesses of the layers according to the Z axis are not to scale relative to the lateral dimensions according to the X and Y axes.

The present disclosure relates to a structure 100 for RF applications comprising a high-resistivity support substrate 1. High resistivity is understood to mean a resistivity higher than 1000 ohm.cm, advantageously between 4 and 10 kOhm.cm. The support substrate 1 can be made of materials commonly used in the microelectronic, optic, optoelectronic or photovoltaic industries. In particular, the support substrate 1 can comprise at least one material selected from the following group: silicon, silicon-germanium, silicon carbide, etc.

Figure 1A:
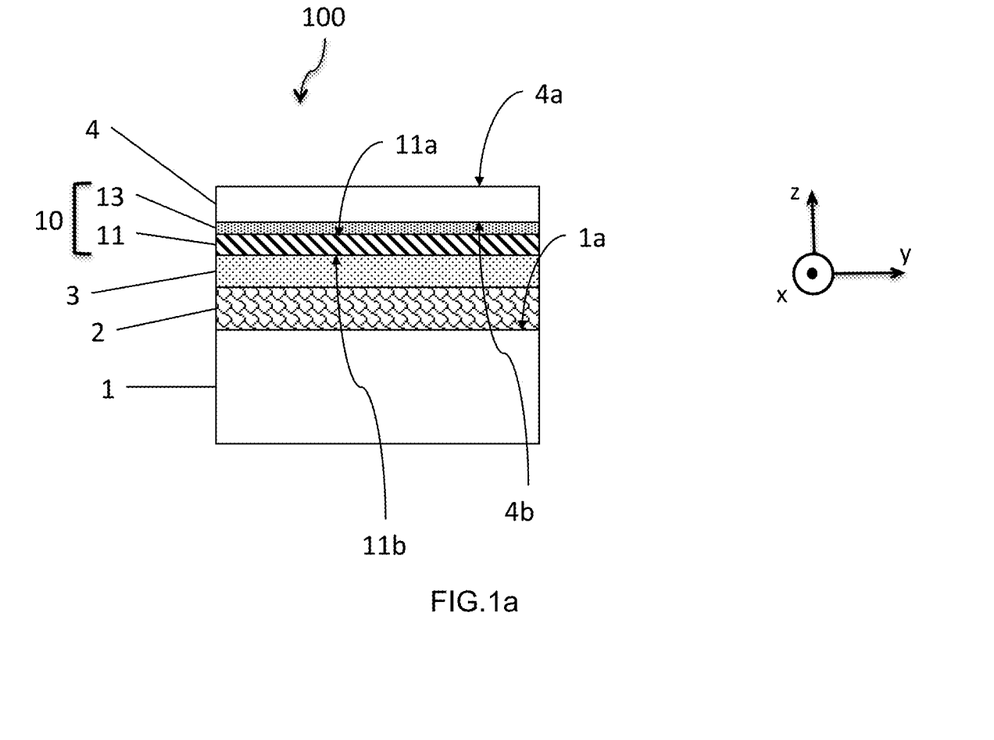
FIGS. 1a and 1b show structures according to a first embodiment of the present disclosure.

The front surface 1a of the support substrate 1 defines a main plane (x, y) as shown in FIG. 1a. Advantageously, the support substrate 1 is in the shape of a circular wafer, with a diameter of 150, 200, 300 or 450 mm, for example.

The structure 100 likewise comprises a charge-trapping layer 2 arranged on the front surface 1a of the support substrate 1. Arranged is understood to mean that the charge-trapping layer 2 can be either directly in contact with the front surface 1a of the support substrate 1 or rigidly connected to same, via one or more intermediate layers. The term "arranged" used hereinafter can be interpreted in a similar manner.

Advantageously, the charge-trapping layer 2 comprises a polycrystalline silicon material, with a defect density that is favorable for trapping free electric charges that are capable of developing in the support substrate 1. Evidently, the charge-trapping layer 2 can likewise comprise other types of materials capable of providing the trapping function and compatible with the structure 100 and the use thereof. The trapping layer 2 has a thickness of several tens of nanometers to several microns, for example, 50 nm to 3 microns.

The structure 100 also comprises a first dielectric layer 3 arranged on the charge-trapping layer 2. In certain embodiments, according to the present disclosure, the first dielectric layer 3 will constitute the buried insulating layer of the structure 100, which, in particular, will electrically insulate the active layer 4 from the support substrate 1. Advantageously, without this having any limiting effect, the first dielectric layer 3 will comprise at least one of the materials chosen among: silicon dioxide, silicon nitride, aluminum oxide, etc. The thickness thereof can range, for example, from 10 nm to 3 µm.

The structure 100 likewise comprises an active layer 4 arranged on the first dielectric layer 3. The active layer 4 corresponds to the layer in and/or on which RF components can be produced. The active layer 4 has a free surface 4a or front surface and a back surface 4b rigidly bonded to the underlying layers. The active layer 4 can advantageously be made from semiconductor materials and/or piezoelectric materials. Advantageously, without this having any limiting effect, the active layer 4 comprises at least one of the materials chosen among: silicon, silicon carbide, silicon-germanium, lithium niobate, lithium tantalate, quartz, aluminum nitride, etc. The active layer 4 can have a thickness of several nanometers (for example, 10 nm) to several microns, or even several tens of microns (for example, 50 µm), depending on the components to be manufactured.

Finally, the structure 100 according to the present disclosure comprises at least one buried electrode 10 arranged above or inside the charge-trapping layer 2: FIG. 1a depicts an embodiment in which the buried electrode 10 is located above the charge-trapping layer 2; in particular, it is located immediately below the active layer 4.

The buried electrode 10 comprises an electrically conductive layer 11 and a second dielectric layer 13 (hereinafter referred to as second dielectric layer 13). The buried electrode 10 is intended for being biased by applying a voltage to the conductive layer 11, and for generating an effect on the electrical carriers of the active layer 4.

Preferably, without this having any limiting effect, the conductive layer 11 comprises a material selected among monocrystalline silicon, polycrystalline silicon, amorphous silicon, etc., or other materials commonly used for the production of gate electrodes or microelectronic resistors. The material forming the conductive layer 11 advantageously has a resistivity of several ohms.cm to several thousand ohms.cm. It is preferably chosen to be compatible with high-temperature treatments, the structure 100 being likely to be subjected to such treatments for the production of RF components. The conductive layer 11 may have a thickness of from 50 nm to 500 nm, for example.

The second dielectric layer 13 can preferably comprise at least one of the following materials: silicon dioxide, silicon nitride, aluminum oxide, etc. It advantageously has a thickness of from 5 nm to 100 nm. Nevertheless, its thickness may vary between 1 nm and 3 microns, according to the embodiments of the present disclosure.

The conductive layer 11 has two surfaces, a first surface 11a and a second surface 11b parallel to the main plane (x, y): in the example of FIG. 1a, the first surface 11a is in contact with the second dielectric layer 13 and the second surface 11b is in contact with the first dielectric layer 3.

Figure 1B:
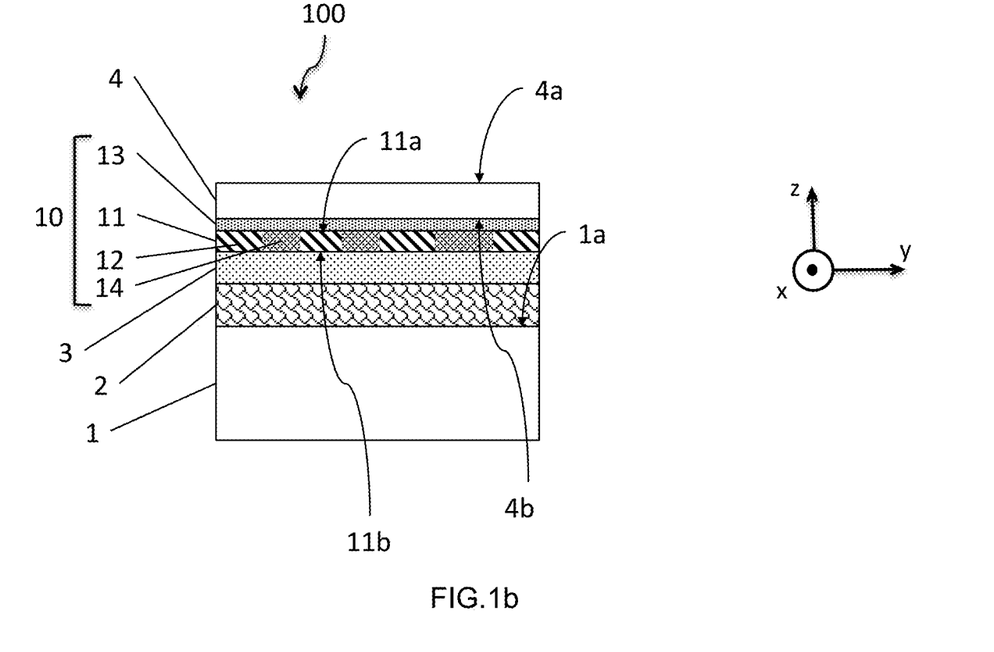
Figure 2A:
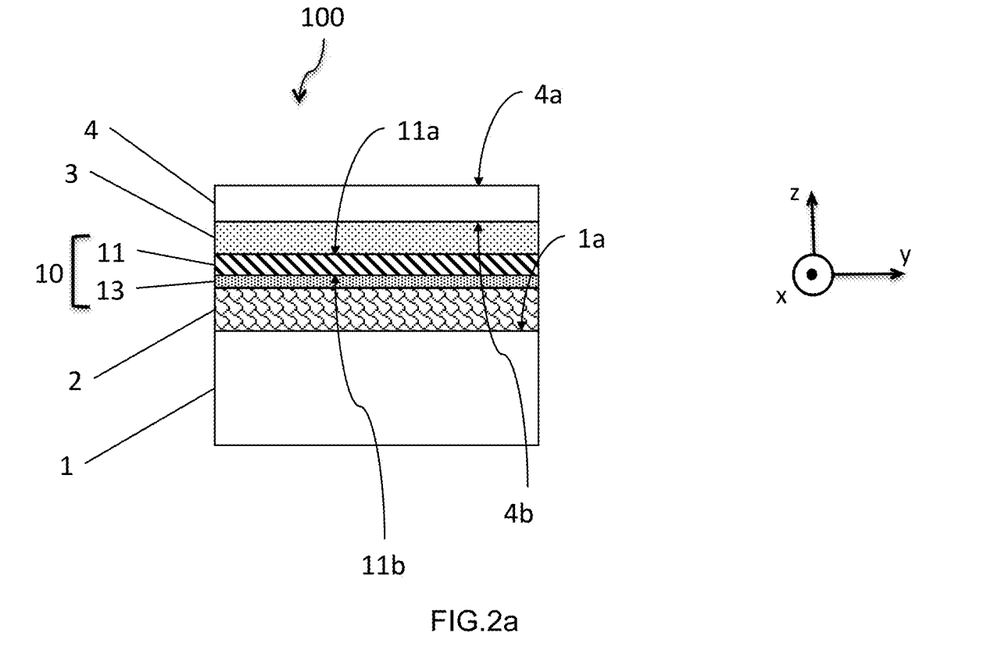
FIGS. 2a and 2b show structures according to a second embodiment of the present disclosure.
Figure 2B:
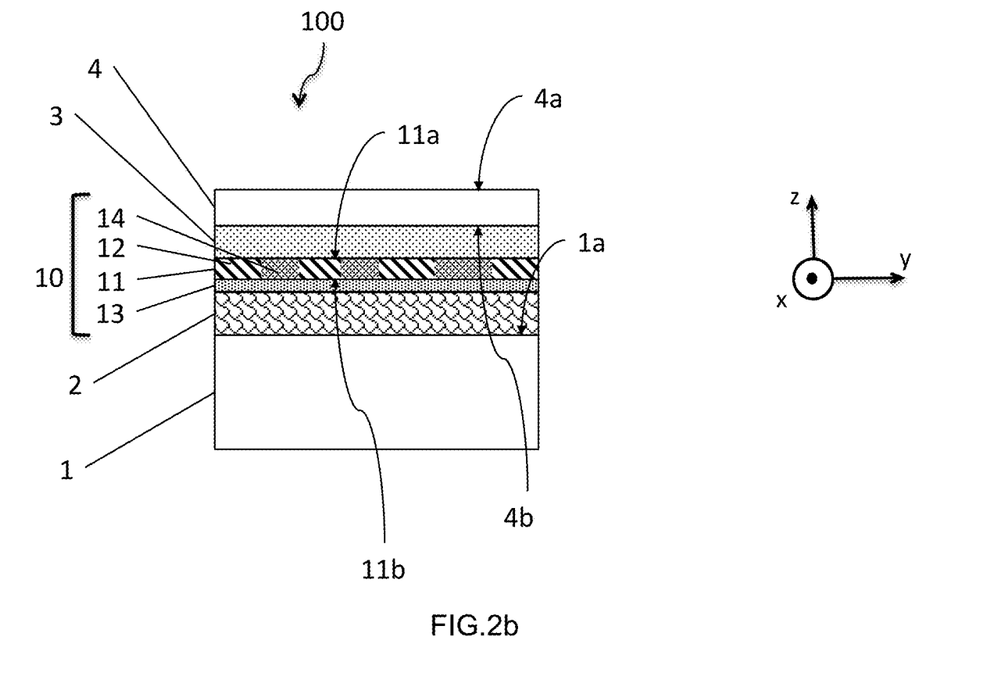

Advantageously, the buried electrode 10 comprises a plurality of electrically insulating walls 14, extending between the first dielectric layer 3 and the second dielectric layer 13 (FIGS. 1b and 2b). The insulating walls 14 segment the conductive layer 11 into a plurality of conductive blocks 12, insulated from one another by the insulating walls 14.

According to the present disclosure, it would thus be possible to apply an electric voltage to at least one conductive block 12 of the buried electrode 10, which is electrically insulated from the other layers of the structure 100, and, in particular, from the active layer 4 and from the support substrate 1. The conductive block 12 is advantageously located at least opposite the active region of a transistor that will be produced in the active layer 4: the transistor can then benefit from bias on the back surface 4b of the active layer 4, in addition to the usual bias thereof by a gate electrode. The use of back bias makes it possible to increase the breakdown voltage of the transistor and thus limits the number of transistors to be placed in series in order to withstand the voltage applied to the terminals of the RF device (a switching unit, for example). The serial resistance of the device can be reduced and the linearity thereof is improved.

According to a first embodiment, shown in FIGS. 1a and 1b, the buried electrode 10 is arranged between the active layer 4 and the first dielectric layer 3, the second dielectric layer 13 being in contact with the active layer 4, parallel to the main plane (x, y).

In this case, the second dielectric layer 13 has a thickness of less than 400 nm, preferably on the order of from 50 nm to 100 nm, so that the voltage applied to the conductive layer 11 of the buried electrode 10 can have an effect on the electrical carriers of the active layer 4.

The structure 100 presented in FIG. 1a can be produced using various methods. Some of these manufacturing variants are described hereunder.

The charge-trapping layer 2 is first deposited on the support substrate 1. For example, a layer of polycrystalline silicon, constituting the charge-trapping layer 2, may be deposited by a chemical vapor or liquid deposition technique, or else by epitaxial growth on a support substrate 1 made of silicon. The trapping layer 2 has a thickness in the aforementioned range such as, for example, on the order of 2 microns.

The active layer 4 is added to the support substrate 1 including the charge-trapping layer 2 by one of the thin layer transfer techniques based on adhesion by molecular bonding: indeed, such direct adhesion has the advantage of being perfectly compatible with high-temperature treatments. These thin layer transfer techniques can include, in particular, the following:
 the SMART CUT® method, which is based on implanting light hydrogen and/or helium ions in a donor substrate (from which the active layer 4 is made), and assembling the donor substrate by molecular bonding with the support substrate 1; a detachment step then makes it possible to separate a thin layer from the donor substrate (the active layer 4), at the fragile plane defined by the ion implantation depth. Finishing steps, possibly including high-temperature thermal treatments, finally restore the crystalline quality and surface quality required for the active layer 4. This method is particularly well suited to the production of active thin layers, with a thickness of several nanometers to around 1.5 microns, for example, for the silicon layers;
 the SMART CUT® method followed by an epitaxy step that makes it possible to obtain thicker active layers, for example, of several tens of nm to 20 microns; and
 the methods for direct adhesion and mechanical, chemical and/or mechanical-chemical thinning involve assembling the donor substrate (from which the active layer 4 is made) by molecular bonding with the support substrate 1, and then thinning the donor substrate until the desired thickness of the active layer 4 is achieved, for example, by grinding and polishing (CMP, or chemical mechanical polishing). These methods are suitable, in particular, for the transfer of thick layers, for example, from several microns to a plurality of tens of microns, and up to several hundred microns.

Considering the aforementioned layer transfer techniques, it is convenient to define the substrate, between the donor substrate (from which the active layer 4 is made) or the support substrate 1 (on which the charge-trapping layer 2 is deposited), on which the intermediate layers such as the first dielectric layer 3, the conductive layer 11 and the second dielectric layer 13 of the buried electrode 10 (FIG. 1a) will be formed, prior to assembling the two substrates by molecular bonding at a bonding interface.

According to a first assembly option, the bonding interface is located between the second dielectric layer 13 and the conductive layer 11. This means that the second dielectric layer 13 has been formed on the donor substrate; for example, this layer is made up of a layer of silicon oxide, grown thermally on the donor substrate. In addition, the first dielectric layer 3, and then the conductive layer 11, are deposited in series on the charge-trapping layer 2. The first dielectric layer 3 comprises, for example, a layer of silicon oxide grown thermally on the charge-trapping layer 2 or deposited by chemical deposition; the conductive layer 11 is made up of a layer of polycrystalline silicon with a resistivity of several ohms.cm to several kOhms.cm. In the configuration depicted in FIG. 1b, the conductive layer 11 comprises insulating walls 14 that define a plurality of conductive blocks 12. As is generally known in the art, the formation of the conductive layer 11 then requires at least one step of lithography and etching in order to define the distribution of the conductive blocks 12 and the insulating walls 14 in the plane (x, y) and to form them in series.

According to a second assembly option, the bonding interface is located between the conductive layer 11 and the first dielectric layer 3. In this case, the second dielectric layer 13 is formed on the donor substrate, since the conductive layer 11 is formed on the second dielectric layer 13. Furthermore, the first dielectric layer 3 is deposited on the charge-trapping layer 2 that is rigidly bonded to the support substrate 1.

According to a third assembly option, the bonding interface is located between the first dielectric layer 3 and the charge-trapping layer 2. In this case, the second dielectric layer 13 is first formed on the donor substrate, then the conductive layer 11 is formed on the second dielectric layer 13, and finally the first dielectric layer 3 is formed on the conductive layer 11.

Other assembly options obviously exist, for which, in particular, the adhesion interface can be placed in one of the intermediate layers, for example, at the middle of the first dielectric layer 3. For example, a first portion of the first dielectric layer 3 is formed on the donor substrate (from which the active layer 4 is made), and a second portion of the first dielectric layer 3 is formed on the side of the support substrate 1 after the formation of the underlying layers.

In each of the aforementioned assembly options, the donor and support substrates, provided with the respective layers thereof, are assembled by molecular bonding. The implementation of either of the preceding layer transfer techniques then leads to the formation of the active layer 4.

According to a second embodiment, shown in FIGS. 2a and 2b, the buried electrode 10 is deposited between the first dielectric layer 3 and the charge-trapping layer 2, the second dielectric layer 13 being in contact with the trapping layer, parallel to the main plane (x, y). The first surface 11a of the conductive layer 11 is in contact with the first dielectric layer 3 and the second surface 11b thereof is in contact with the second dielectric layer 13.

In this case, the first dielectric layer 3 has a thickness of less than 400 nm, preferably less than 200 nm, so that the voltage applied to the conductive layer 11 of the buried electrode 10 can have an effect on the electrical carriers of the active layer 4. The second dielectric layer 13, on the other hand, can have a thickness of up to several microns, if this is required for the application.

The techniques for transferring layers and manufacturing insulating walls 14 in the conductive layer 11 mentioned in the first embodiment, likewise apply to this second embodiment. Different assembly options can be implemented, according to whether the formation of intermediate layers of the structure 100 (first dielectric layer 3, conductive layer 11 and second dielectric layer 13) is carried out on the donor substrate or the support substrate 1.

Figure 3:
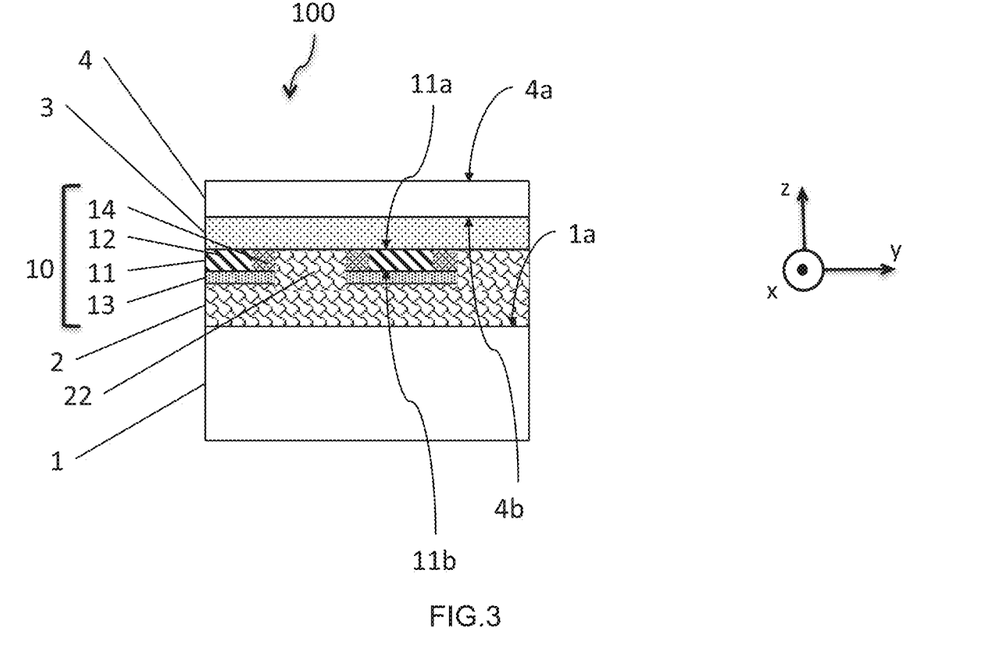
FIG. 3 shows a structure according to a third embodiment of the present disclosure.

According to a third embodiment, depicted in FIG. 3, the buried electrode 10 is arranged as above between the first dielectric layer 3 and the charge-trapping layer 2 and it includes conductive blocks 12 electrically insulated from one another by insulating walls 14; furthermore, the buried electrode 10 is discontinuous in the main plane (x, y) and a plurality of charge-trapping areas 22 extend between the first dielectric layer 3 and the charge-trapping layer 2. The trapping areas 22 are insulated from the conductive blocks 12 by the insulating walls 14.

The trapping areas 22 can be made from the same material as the charge-trapping layer 2 or from a different material, having electric charge-trapping properties.

In this third embodiment of the present disclosure, the first dielectric layer 3 has a thickness of less than 400 nm, preferably less than 200 nm, so that the voltage applied to the conductive layer 11 of the buried electrode 10 can have an effect on the electrical carriers of the active layer 4.

The layer transfer techniques described for the first embodiment also apply to this third embodiment. Advantageously, an assembly option that involves placing the adhesion interface in the first dielectric layer 3 may be implemented. A first portion of the first dielectric layer 3 is formed on the donor substrate (from which the active layer 4 is made); a second portion of the first dielectric layer 3 is formed from the side of the support substrate 1 after the formation of the underlying layers. The charge-trapping layer 2 is first produced on the support substrate 1. The second dielectric layer 13 is then deposited (for example, by chemical deposition or thermal growth). A lithography and etching step make it possible to remove the second dielectric layer 13 from the future trapping areas 22. Other consecutive steps of masking, depositing and etching then make it possible to form the conductive blocks 12, the insulating walls 14 and the trapping areas 22. The second portion of the first dielectric layer 3 is then deposited above the conductive blocks 12, the insulating walls 14 and the trapping areas 22. A step of planarizing the second portion of the first dielectric layer 3 then makes it possible to obtain a good surface condition with a view to performing direct molecular bonding.

The donor and support substrates, provided with their respective layers, are then assembled by molecular bonding. The implementation of either of the aforementioned layer transfer techniques then leads to the formation of the active layer 4.

Figure 4:
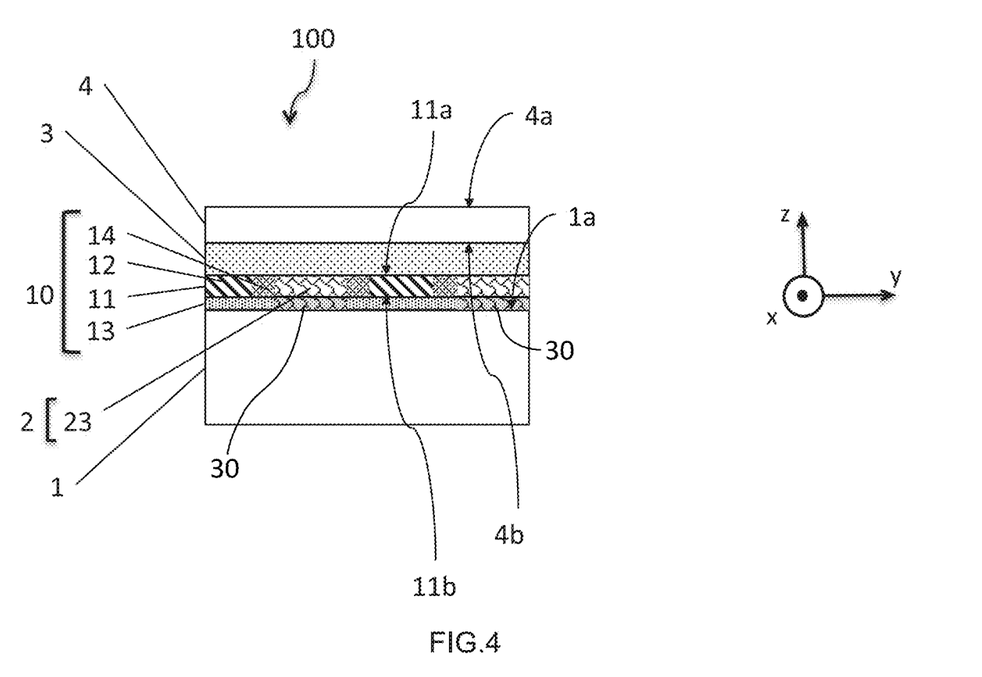
FIG. 4 shows a structure according to a fourth embodiment of the present disclosure.

According to a fourth embodiment shown in FIG. 4, the buried electrode 10 is arranged in the charge-trapping layer 2. The second dielectric layer 13 is in contact with the front surface 1a of the support substrate 1 along the main plane (x, y). The buried electrode 10 comprises a plurality of insulating walls 14 extending between the first and second (3, 13) dielectric layers and defining a plurality of conductive blocks 12 of the conductive layer 11, insulated from one another by the insulating walls 14. Each conductive block 12 is electrically insulated from at least one charge-trapping area 23 forming the charge-trapping layer 2, by the insulating walls 14. The charge-trapping area 23 extends between the first dielectric layer 3 and the support substrate 1.

According to a variant that can be applied to the various aforementioned embodiments, the structure 100 can comprise a third dielectric layer 30, arranged between the charge-trapping layer 2 (or the charge-trapping areas 23) and the support substrate 1. The third dielectric layer 30 can comprise at least one of the following materials: silicon dioxide, silicon nitride, aluminum oxide, etc. The third dielectric layer 30 is advantageous, in particular, in that it prevents or at least considerably limits the recrystallization of the charge-trapping layer 2 (when the charge-trapping layer 2 is made of, for example, polycrystalline silicon) during high-temperature thermal treatments likely to be used for manufacturing the structure according to the present disclosure.

In the structure 100 according to any of the mentioned embodiments, at least one conductive block 12 can be electrically connected to a contact pad 40 by a conductive via 41. The conductive via 41 passes through a portion of the structure 100 to run from the conductive block 12 to the contact pad 40; in the example of FIG. 5a, the conductive via 41 passes, in particular, through the active layer 4 and the second dielectric layer 13. The contact pad 40 is arranged on a free surface 4a of the active layer 4, and is electrically insulated from the active layer 4.

Figure 5A:
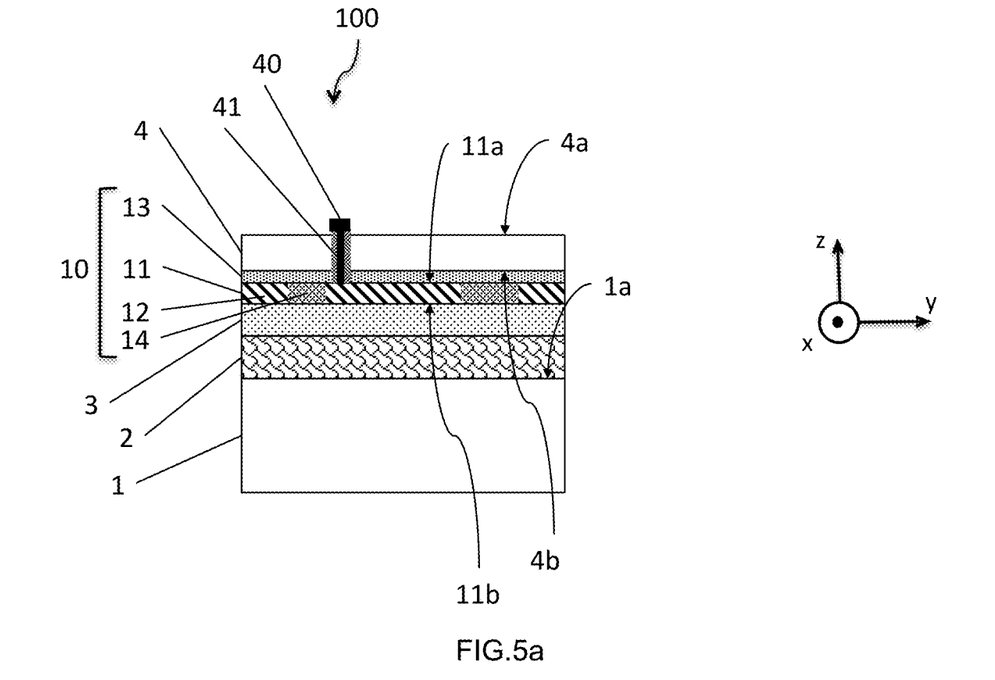
FIGS. 5a and 5b show structures according to the present disclosure.

The contact pad 40 is formed by an electrically conductive material. Thus, a voltage can be applied to the conductive block 12 of the buried electrode 10 by way of the conductive pad 40. The conductive via 41 is formed using techniques that are known to a person skilled in the art, by making a trench in which the walls are electrically insulated from the layers through which it passes, and the insulated trench is then filled with a conductive material such as, for example, doped polycrystalline silicon.

A plurality of conductive vias 41 can be made to connect each embedded conductive block 12 independently to a contact pad 40.

Alignment marks may be formed on the support substrate 1 (or on the donor substrate from which the active layer 4 is made) during the production of conductive blocks 12. These alignment marks may be used during the steps of producing conductive vias 41, in order to form the vias 41 vertically in line with the conductive blocks 12.

Figure 5B:
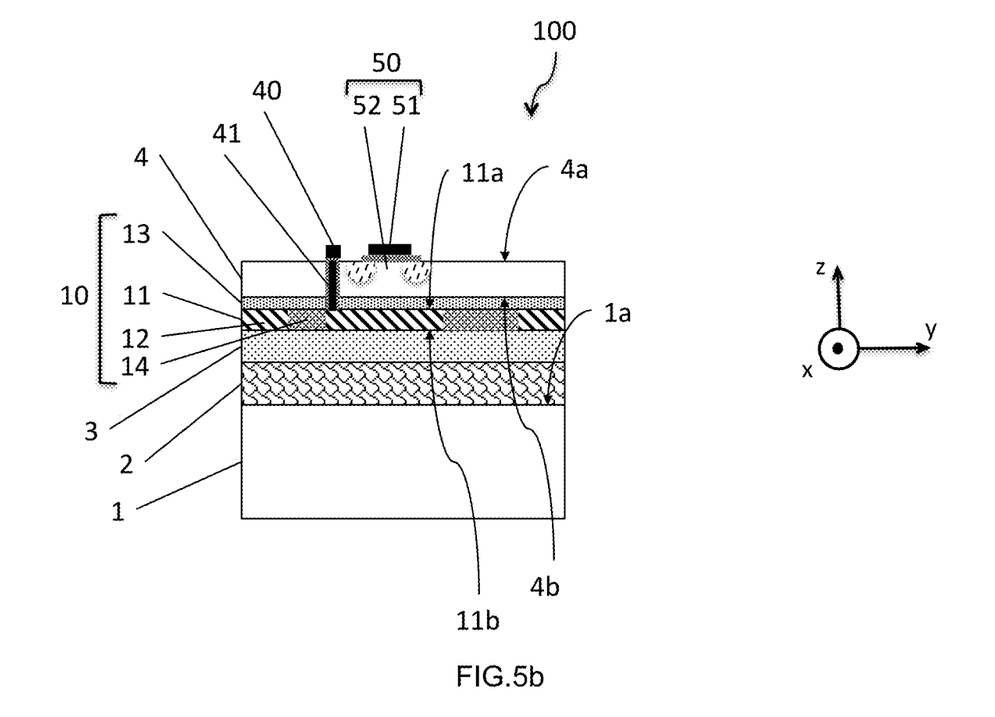

The structure 100 can likewise comprise a device in and/or on the active layer 4, including at least one transistor 50 in which a gate electrode 51 arranged on the free surface 4a of the active layer 4 is opposite at least one conductive block 12 of the buried electrode 10 (FIG. 5b). The alignment marks formed during the production of the conductive blocks 12 of the buried electrode 10 are likewise used during steps for manufacturing the electronic device on the active layer 4.

The structure 100 according to the present disclosure is particularly suitable for RF devices, in particular, such as antenna adapters or switching units for mobile telephones. The integration of the buried electrode 10 in the structure 100 allows for easier manufacturing of devices comprising transistors with back bias. The use of a buried electrode 10 to bias the active region 52 of a transistor 50 by the back surface (back bias) makes it possible to increase the breakdown voltage of the transistor and thus to limit the number of transistors to be arranged in parallel in each device. Finally, the presence of the charge-trapping layer 2 in the structure 100 ensures that a high resistivity of the support substrate 1 is maintained.

The structure 100 according to the present disclosure thus makes it possible to achieve high performance in the field of high-frequency applications.

The present disclosure is obviously not limited to the described embodiments, and alternative embodiments can be provided without departing from the context of the present disclosure as defined by the claims.

The invention claimed is:

1. A structure for RF applications, comprising:
   a high-resistivity support substrate having a front surface defining a main plane of a coordinate system;
   a charge-trapping layer arranged on the front surface of the support substrate;
   a first dielectric layer arranged on the charge-trapping layer;
   an active layer arranged on the first dielectric layer such that the first dielectric layer is between the active layer and the charge-trapping layer; and
   at least one buried electrode arranged above or inside the charge-trapping layer, the buried electrode comprising a conductive layer and a second dielectric layer.

2. The structure of claim 1, wherein the second dielectric layer has a thickness in a range extending from 5 nm to 100 nm.

3. The structure of claim 1, wherein the conductive layer comprises a material selected from among monocrystalline silicon, polycrystalline silicon, and amorphous silicon.

4. The structure of claim 1, wherein the conductive layer has a thickness in a range extending from 50 nm to 500 nm.

5. The structure of claim 1, wherein the conductive layer has a resistivity of several ohms.cm to several thousand ohms.cm.

6. The structure of claim 1, wherein the electrode is arranged between the active layer and the first dielectric layer, the second dielectric layer being in contact with the active layer along the main plane.

7. The structure of claim 1, wherein the electrode is arranged between the first dielectric layer and the charge-trapping layer, the second dielectric layer being in contact with the charge-trapping layer, along the main plane.

8. A structure for RF applications, comprising:
   a high-resistivity support substrate having a front surface defining a main plane of a coordinate system,
   a charge-trapping layer arranged on the front surface of the support substrate;
   a first dielectric layer arranged on the charge-trapping layer;
   an active layer arranged on the first dielectric layer; and
   at least one buried electrode arranged inside the charge-trapping layer, the buried electrode comprising a conductive layer and a second dielectric layer, wherein the second dielectric layer is in contact with the front surface of the support substrate along the main plane, and wherein the electrode comprises a plurality of insulating walls extending between the first and second dielectric layers and defining a plurality of conductive blocks of the conductive layer, each conductive block being insulated from at least one trapping area forming the charge-trapping layer by the insulating walls.

9. A structure for RF applications, comprising:
   a high-resistivity support substrate having a front surface defining a main plane of a coordinate system;
   a charge-trapping layer arranged on the front surface of the support substrate;
   a first dielectric layer arranged on the charge-trapping layer;
   an active layer arranged on the first dielectric layer; and
   at least one buried electrode arranged above or inside the charge-trapping layer, the buried electrode comprising a conductive layer and a second dielectric layer, wherein the conductive layer has two surfaces parallel to the main plane, one surface of the two surfaces in contact with the first dielectric layer and another surface of the two surfaces in contact with the second dielectric layer.

10. The structure of claim 9, wherein the electrode comprises a plurality of insulating walls extending between the first and second dielectric layers and segmenting the conductive layer into a plurality of conductive blocks, the blocks being insulated from one another by the insulating walls.

11. The structure of claim 10, wherein the electrode is arranged between the active layer and the first dielectric layer, the second dielectric layer being in contact with the active layer parallel to the main plane.

12. The structure of claim 10, wherein the electrode is arranged between the first dielectric layer and the charge-trapping layer, the second dielectric layer being in contact with the charge-trapping layer, parallel to the main plane.

13. The structure of claim 12, wherein the electrode is discontinuous in the main plane and a plurality of charge-trapping areas extend between the first dielectric layer and the charge-trapping layer, the charge-trapping areas being insulated from the conductive blocks by the insulating walls.

14. The structure of claim 9, wherein the electrode is arranged in the charge-trapping layer, the second dielectric layer being in contact with the front surface of the support substrate along the main plane, and wherein the electrode comprises a plurality of insulating walls extending between the first and second dielectric layers and defining a plurality of conductive blocks of the conductive layer, each conductive block being insulated from at least one trapping area forming the charge-trapping layer by the insulating walls.

15. The structure of claim 14, wherein at least one conductive block is electrically connected to a contact pad arranged on a free surface of the active layer by a conductive via passing through a portion of the structure from the conductive block to the contact pad.

16. The structure of claim 15, further comprising a device in and/or on the active layer, the device comprising at least one transistor including a gate electrode arranged on the free surface of the active layer, the gate electrode located opposite at least one conductive block of the buried electrode.

17. The structure of claim 10, wherein at least one conductive block is electrically connected to a contact pad arranged on a free surface of the active layer by a conductive via passing through a portion of the structure from the conductive block to the contact pad.

18. The structure of claim 17, further comprising a device in and/or on the active layer, the device comprising at least one transistor including a gate electrode arranged on the free surface of the active layer, the gate electrode located opposite at least one conductive block of the buried electrode.

* * * * *